United States Patent
Choi et al.

(10) Patent No.: US 10,866,451 B2
(45) Date of Patent: Dec. 15, 2020

(54) DISPLAY DEVICE

(71) Applicant: SAMSUNG DISPLAY CO., LTD., Yongin-si (KR)

(72) Inventors: Joo Young Choi, Cheonan-si (KR); Yoon Seop Shim, Asan-si (KR); Gyu Ik Kim, Hwaseong-si (KR); Hyo Taek Lim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 30 days.

(21) Appl. No.: 16/129,047

(22) Filed: Sep. 12, 2018

(65) Prior Publication Data

US 2019/0219866 A1 Jul. 18, 2019

(30) Foreign Application Priority Data

Jan. 18, 2018 (KR) ........................ 10-2018-0006605

(51) Int. Cl.
| | | |
|---|---|---|
| *G02F 1/1335* | (2006.01) | |
| *H01L 27/12* | (2006.01) | |
| *G09G 3/36* | (2006.01) | |
| *G02F 1/1343* | (2006.01) | |
| *G02F 1/1362* | (2006.01) | |
| *G02F 1/13357* | (2006.01) | |

(52) U.S. Cl.
CPC ..... *G02F 1/133514* (2013.01); *G09G 3/3607* (2013.01); *H01L 27/124* (2013.01); *G02F 1/133528* (2013.01); *G02F 1/133617* (2013.01); *G02F 1/134309* (2013.01); *G02F 1/136286* (2013.01); *G02F 2001/133548* (2013.01); *G02F 2201/123* (2013.01); *H01L 27/1214* (2013.01)

(58) Field of Classification Search
CPC ......... G02F 1/133514; G02F 1/133512; G02F 1/133528; G02F 1/134309; G02F 1/136286
See application file for complete search history.

(56) References Cited

U.S. PATENT DOCUMENTS

2019/0391418 A1* 12/2019 Yamaguchi ............... G02F 1/13

FOREIGN PATENT DOCUMENTS

| KR | 1020100093858 | 8/2010 |
|---|---|---|
| KR | 1020150025651 | 3/2015 |
| KR | 1020150115080 | 10/2015 |
| KR | 10-1686107 | 12/2016 |
| KR | 1020170096583 | 8/2017 |
| KR | 1020170110950 | 10/2017 |

\* cited by examiner

*Primary Examiner* — Dung T Nguyen
(74) *Attorney, Agent, or Firm* — F. Chau & Associates, LLC

(57) ABSTRACT

A display device includes: a first substrate including a display area; a thin film transistor positioned on the first substrate; a pixel electrode connected to the thin film transistor; a color filter overlapping the pixel electrode; a second substrate overlapping the first substrate; a liquid crystal layer positioned between the first substrate and the second substrate; and a stain correction layer positioned between the second substrate and the liquid crystal layer and including a semiconductor nanocrystal. The display area includes a first region and a second region excluding the first region. The stain correction layer is positioned in the first region.

22 Claims, 15 Drawing Sheets

DISPLAY DEVICE

CROSS-REFERENCE TO RELATED APPLICATION

This U.S. application claims the benefit of priority under 35 U.S.C. § 119 to Korean Patent Application No. 10-2018-0006605 filed in the Korean Intellectual Property Office on Jan. 18, 2018, the entire disclosure of which is incorporated by reference herein.

BACKGROUND

(a) Technical Field

The present disclosure relates to a display device.

(b) Discussion of Related Art

A liquid crystal display may include two field generating electrodes, a liquid crystal layer, a color filter, and a polarization layer. Light emitted from a light source passes through the liquid crystal layer, the color filter, and the polarization layer before reaching a viewer. However, some of the emitted light may be lost in the polarization layer or the color filter.

SUMMARY

At least one exemplary embodiment of the inventive concept provides a display device that reduces or eliminates stain defects and has a more uniform luminance. A stain defect may be a part of the display that appears excessively dark. Further, at least one exemplary embodiment of the inventive concept may have an improved viewing angle.

A display device according to an exemplary embodiment of the inventive concept includes: a first substrate including a display area; a thin film transistor positioned on the first substrate; a pixel electrode connected to the thin film transistor; a color filter overlapping the pixel electrode; a second substrate overlapping the first substrate; a liquid crystal layer positioned between the first substrate and the second substrate; and a stain correction layer positioned between the second substrate and the liquid crystal layer and including a semiconductor nanocrystal. The display area includes a first region and a second region excluding the first region. The stain correction layer is positioned in the first region.

In an embodiment, the first region includes a horizontal or vertical portion that crosses the display area.

In an embodiment, the first region includes a circular shaped region.

In an embodiment, the first region includes a frame shaped region that overlaps respective edges of the display area.

In an exemplary embodiment, the thin film transistor includes a first thin film transistor positioned in the first region and a second thin film transistor positioned in the second region, and channel lengths of the first thin film transistor and the second thin film transistor are different from one another.

In an embodiment, the channel length of the first thin film transistor is shorter than the channel length of the second thin film transistor.

In an embodiment, a thickness of the liquid crystal layer overlapping the first region and a thickness of the liquid crystal layer overlapping the second region are different from one another.

In an embodiment, the pixel electrode includes a crossed stem part and a minute branch part extending from the crossed stem part, and the width of the minute branch part positioned in the first region is different from the width of the minute branch part positioned in the second region.

In an embodiment, the width of the minute branch part positioned in the first region is smaller than the width of the minute branch part positioned in the second region.

In an embodiment, the first region overlaps a plurality of pixel electrodes, and the stain correction layer includes a plurality of layers shaped to connect to each other over the plurality of pixel electrodes.

In an embodiment, the stain correction layer includes a first semiconductor nanocrystal converting incident light into red light, and a second semiconductor nanocrystal converting the incident light into green light.

In an embodiment, the stain correction layer further includes a third semiconductor nanocrystal converting the incident light into blue light.

In an embodiment, the stain correction layer includes a first stain correction layer overlapping a region emitting red light, a second stain correction layer overlapping a region emitting green light, and a third stain correction layer overlapping a region emitting blue light.

In an embodiment, the first stain correction layer, the second stain correction layer, and the third stain correction layer are separated from each other.

In an embodiment, the stain correction layer positioned in the first region includes a plurality of regions having different thicknesses.

A display device according to an exemplary embodiment of the inventive concept includes: a first substrate including a display area; a first thin film transistor positioned on the first substrate in the first region; a pixel electrode connected to the first thin film transistor; a stain correction layer positioned in the first region overlapping the pixel electrode and including a semiconductor nanocrystal; a second substrate overlapping the first substrate; and a color filter positioned between the second substrate and the stain correction layer. A channel length of the first thin film transistor is different from a channel length of a second thin film transistor positioned in the second region.

A display device according to an exemplary embodiment of the inventive concept includes: a first substrate including a display area having a first region and a second region; a second substrate opposing the first substrate; a color filter disposed on the second substrate; a liquid crystal layer positioned between the first and second substrates; and a dispersion medium comprising a plurality of semiconductor nanocrystals. The dispersion medium is positioned between the color filter and the liquid crystal layer. The dispersion medium is only disposed in the first region among the first and second regions.

DETAILED DESCRIPTION OF THE EXEMPLARY EMBODIMENTS

Figure 1:
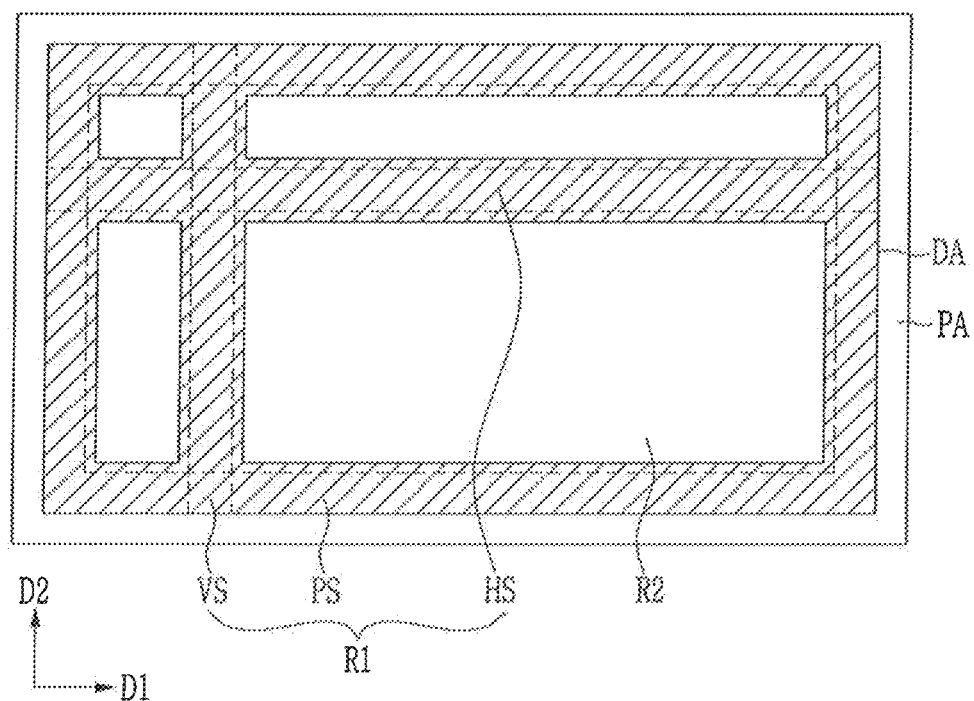
FIG. 1 is a top plan view schematically showing a display device including a first region and a second region according to an exemplary embodiment of the inventive concept.

Hereinafter, the present invention will be described more fully with reference to the accompanying drawings, in which exemplary embodiments of the invention are shown. The described embodiments may be modified in various different ways, all without departing from the spirit or scope of the present invention.

Parts that are irrelevant to the description will be omitted to clearly describe the present invention, and the same elements will be designated by the same reference numerals throughout the specification.

Also, it will be understood that when an element such as a layer, film, region, or substrate is referred to as being "on" another element, it can be directly on the other element or intervening elements may also be present.

Figure 3:
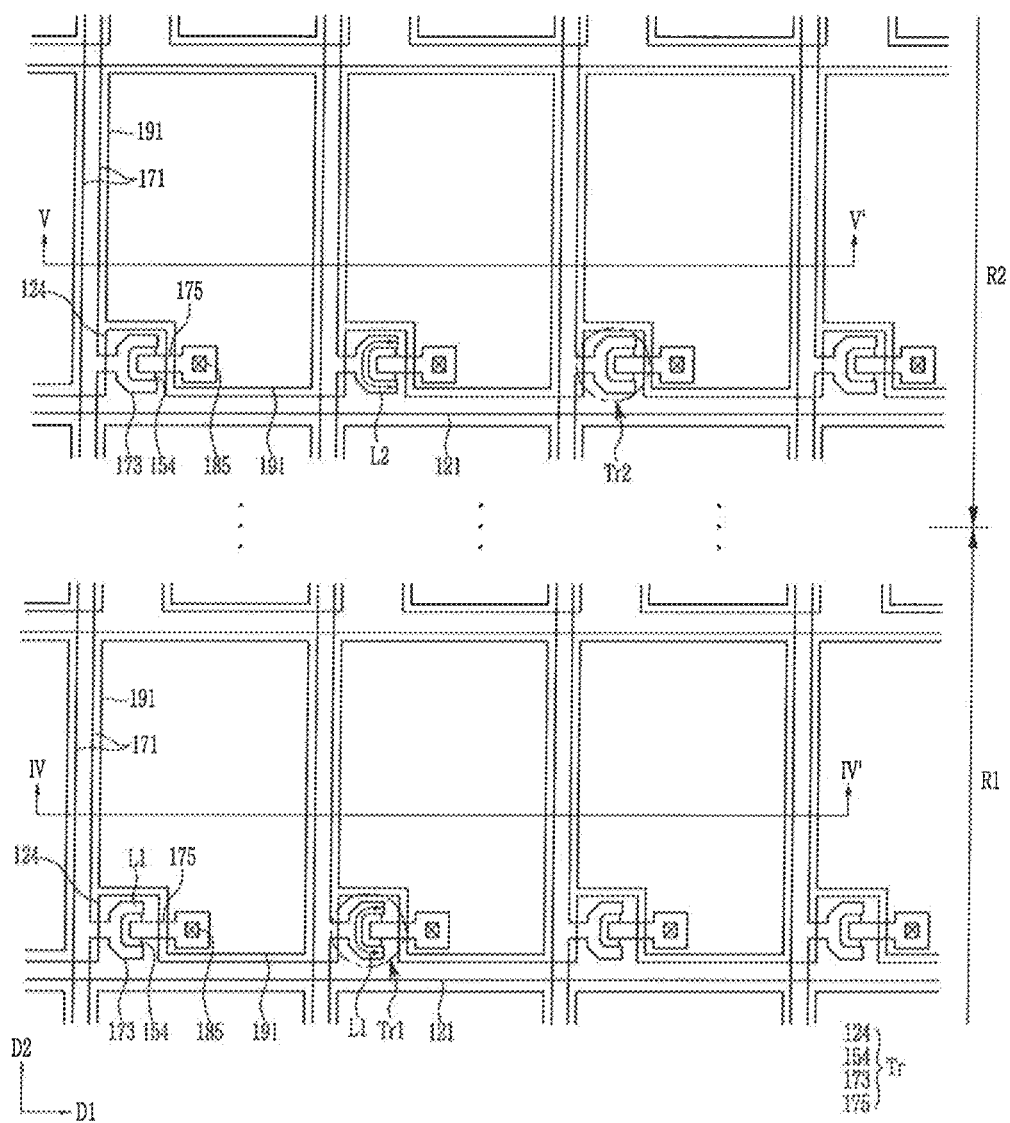
FIG. 3 is a top plan view representing a plurality of pixels positioned at each of a first region and a second region.
Figure 4:
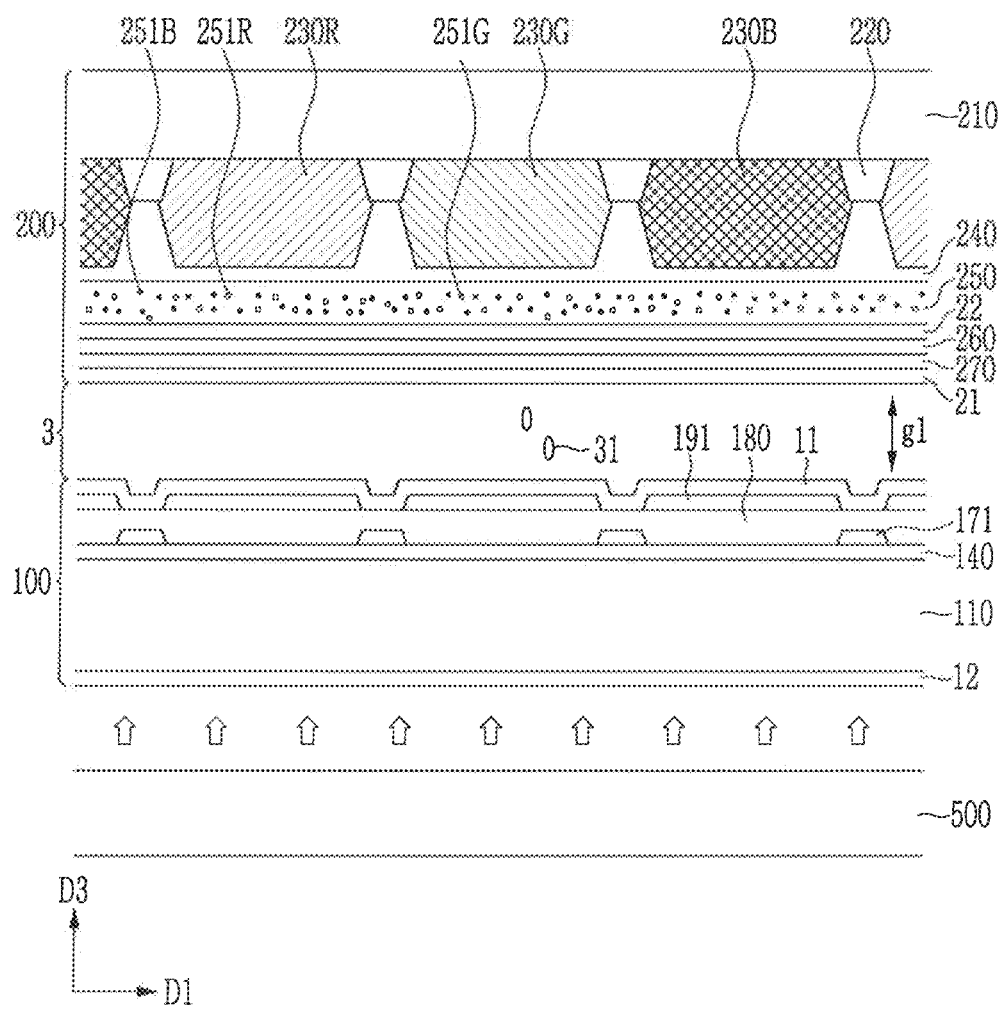
FIG. 4 is a cross-sectional view taken along a line IV-IV' of FIG. 3.
Figure 5:
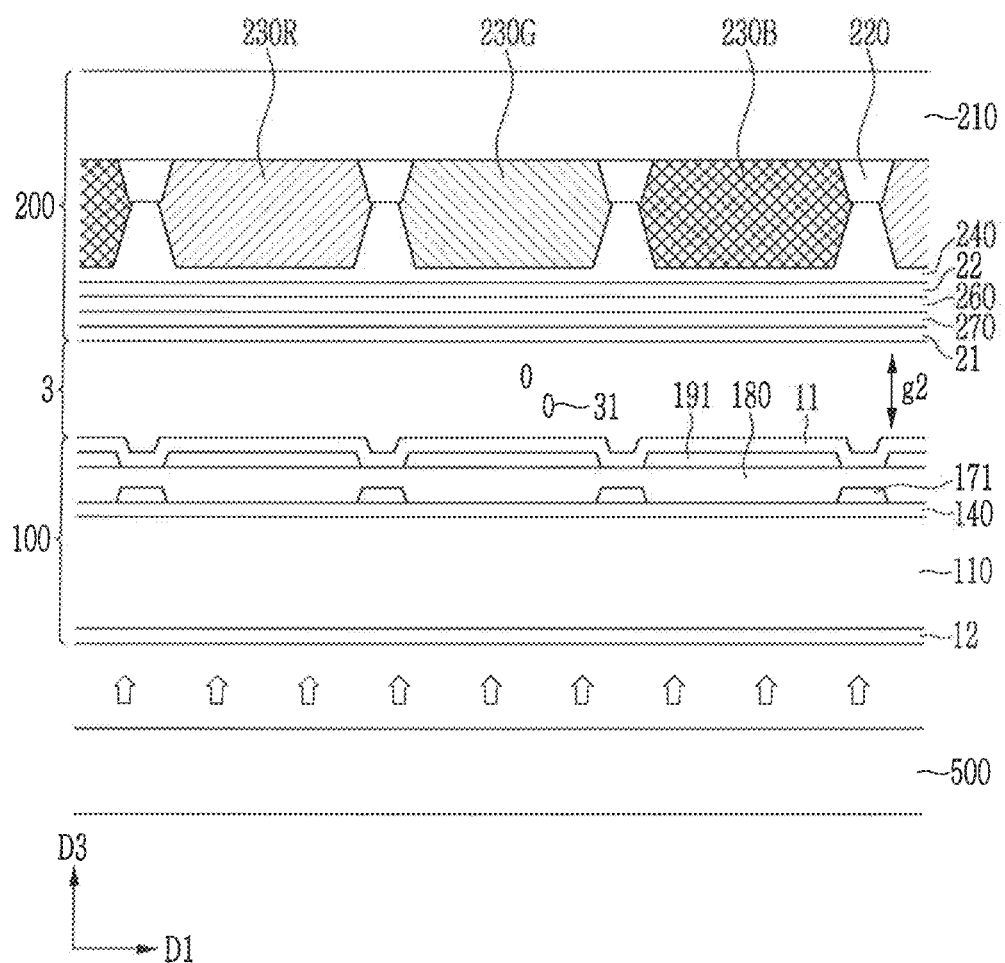
FIG. 5 is a cross-sectional view taken along a line V-V' of FIG. 3.

A display device according to an exemplary embodiment will be described with reference to FIG. 1 to FIG. 5. FIG. 1 is a top plan view schematically showing a display device including a first region and a second region according to an exemplary embodiment, FIG. 2 is a top plan view schematically showing a display device including a first region and a second region according to an exemplary embodiment of the inventive concept, FIG. 3 is a top plan view representing a plurality of pixels positioned at each of a first region and a second region, FIG. 4 is a cross-sectional view taken along a line IV-IV' of FIG. 3, and FIG. 5 is a cross-sectional view taken along a line V-V' of FIG. 3.

Referring to FIG. 1, a display device 10 according to an exemplary embodiment of the inventive concept includes a display area DA for displaying an image and a peripheral area PA positioned at the edge of the display area DA. The peripheral area PA may surround the display area DA. The peripheral area PA may be referred to as a non-display area. The non-display area may include control circuits for driving pixels of the display area DA. For example, the control circuits may include a gate driving circuit for driving gate lines connected to the pixels and a source driving circuit for driving data lines connected to the pixels. The display area DA includes a first region R1 and a second region R2. The first region R1 according to an exemplary embodiment includes at least one among a horizontal region HS, a vertical region VS, and an edge region PS. While, one horizontal region HS and one vertical region VS are shown in FIG. 1, the invention is not limited thereto. For example, a plurality of horizontal regions and vertical regions may be included. In an embodiment, the edge region PS includes a first portion (e.g., upper most horizontal rectangle) parallel to a second portion (e.g., lower most horizontal rectangle), a third portion (e.g., left most vertical rectangle) parallel to a fourth portion (e.g., right most vertical rectangle). In this embodiment, the third portion is connected to the first and second portions, and the fourth portion is connected to the first and second portions so that the edge region PS has a frame or window shape. In an embodiment, the vertical region VS and the horizontal region HS cross one another. In an embodiment, a first edge of the vertical region VS connects to the first portion and a second opposite edge of the vertical region VS connects to the second portion. In an embodiment, a first edge of the horizontal region HS connects to the third portion and a second opposite edge of the horizontal region HS connects to the fourth portion.

Figure 2:
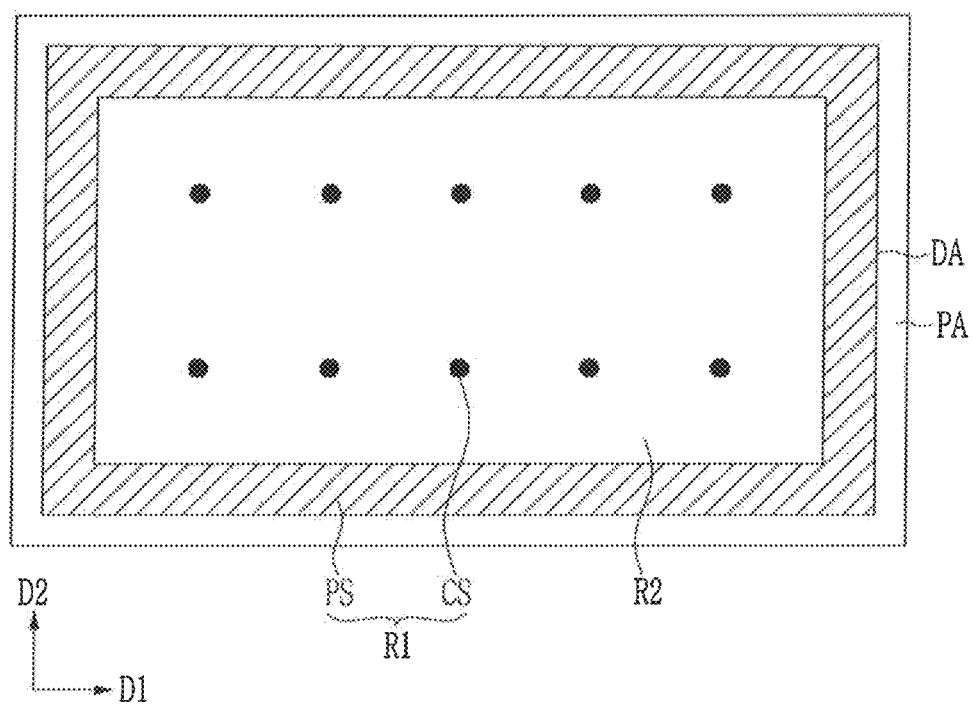
FIG. 2 is a top plan view schematically showing a display device including a first region and a second region according to an exemplary embodiment of the inventive concept.

Referring to FIG. 2, the first region R1 according to an exemplary embodiment includes an edge region PS and an atypical region CS. In an exemplary embodiment, the atypical region CS has a circular shape in a plane. However, the atypical region CS is not limited to having a circular shape. For example, in alternate embodiments, the atypical region CS has an irregular shape. An irregular shape has sides and angles of any length and size.

According to an exemplary embodiment of FIG. 1, the first region R1 includes the horizontal region HS, the vertical region VS, and the edge region PS, and the first region R1 according to an exemplary embodiment of FIG. 2 includes the edge region PS and the atypical region CS. However, the display device according to an exemplary embodiment is not limited thereto, and any combination including at least one among the horizontal region HS, the vertical region VS, the edge region PS, and the atypical region CS is possible. Also, the shape and the position of the first region R1 shown in FIG. 1 and FIG. 2 are merely one example, and are not limited to the shown shape and position.

In an exemplary embodiment of the inventive concept, a stain correction layer 250 is positioned in the first region R1. In this embodiment, the second region R2 does not overlap the stain correction layer 250. The stain correction layer 250 is only selectively positioned in the first region R1. For example, the stain correction layer 250 may entirely overlap the first region R1 or only overlap portions of the first region R1.

The stain correction layer 250 may be formed through a printing process or a coating and exposure process, but is not limited to these methods. The thickness of the stain correction layer 250 may be controlled by controlling a process speed or a coating amount.

Next, a pixel positioned at the first region R1 and a pixel positioned at the second region R2 are described with reference to FIG. 3 to FIG. 5 along with the stacked structure of the display device.

Referring to FIG. 4, a display device includes a light unit 500, a thin film transistor array panel 100, an upper panel 200 overlapping the thin film transistor array panel 100, and a liquid crystal layer 3 positioned between the thin film transistor array panel 100 and the upper panel 200.

The light unit 500 is positioned at a rear surface of the thin film transistor array panel 100 along a third direction D3. The light unit 500 may include a light source generating light, and a light guide (not shown) receiving the light and guiding the received light toward the thin film transistor array panel 100.

The light unit 500 may include any light source emitting blue light, white light, or ultraviolet rays, and may include a light emitting diode (LED) as an example. The light unit 500 may be referred to as a backlight.

The light source may be an edge type disposed on at least one lateral surface of the light guide or a direct type positioned directly below the light guide, but is not limited thereto.

The thin film transistor array panel 100 includes a first polarization layer 12 positioned between a first substrate 110 and the light unit 500. The first polarization layer 12 polarizes light incident from the light unit 500 to the first substrate 110.

The first polarization layer 12 may be at least one of a deposited polarization layer, a coated polarization layer, and a wire grid polarizer, but is not limited thereto. The first polarization layer 12 may be formed on one surface of the first substrate 110 by various methods such as a film type and a printing type, but it is not limited thereto.

Referring to FIG. 3 and FIG. 4, the thin film transistor array panel 100 may include a gate line 121 extending in a first direction D1 between the first substrate 110 and the liquid crystal layer 3 and including a gate electrode 124, a gate insulating layer 140 positioned between the gate line 121 and the liquid crystal layer 3, a semiconductor layer 154 positioned between the gate insulating layer 140 and the liquid crystal layer 3, a data line 171 positioned between the semiconductor layer 154 and the liquid crystal layer 3 and extending in a second direction D2, a source electrode 173 connected to the data line 171, a drain electrode 175 separated from the source electrode 173, and a passivation layer 180 positioned between the data line 171 and the liquid crystal layer 3.

The semiconductor layer 154 forms a channel in a part that is not covered by the source electrode 173 and the drain electrode 175, and the gate electrode 124, the semiconductor layer 154, the source electrode 173, and the drain electrode 175 form one thin film transistor Tr.

In an exemplary embodiment, channel lengths of the first thin film transistor Tr1 positioned in the first region R1 and the second thin film transistor Tr2 positioned in the second region R2 are different from one another. In an exemplary embodiment, the channel length L1 of the first thin film transistor Tr1 is smaller than a channel length L2 of the second thin film transistor Tr2.

In an exemplary embodiment, the first region R1 is a region overlapped by a plurality of light exposers during a manufacturing process. The layer forming the thin film transistor may be exposed a plurality of times by the plurality of light exposers. In an exemplary embodiment, the first thin film transistor Tr1 positioned in the first region R1 has a shorter channel length compared with the second thin film transistor Tr2 positioned in the second region R2.

A pixel electrode 191 is positioned on the passivation layer 180. In an embodiment, the pixel electrode 191 is physically and electrically connected to the drain electrode 175 through a contact hole 185 included in the passivation layer 180.

A first alignment layer 11 may be positioned between the pixel electrode 191 and the liquid crystal layer 3.

The upper panel 200 includes a second substrate 210 overlapping the thin film transistor array panel 100. A light blocking member 220 is positioned between the second substrate 210 and the thin film transistor array panel 100.

The light blocking member 220 may be positioned between a red color filter 230R and a green color filter 230G, between the green color filter 230G and a blue color filter 230B, and between the blue color filter 230B and the red color filter 230R along the first direction D1.

Also, the light blocking member 220 may be positioned between adjacent red color filters 230R, between adjacent green color filters 230G, and between adjacent blue color filters 230B. The light blocking member 220 may have a lattice or straight line shape on a plane.

The light blocking member 220 may prevent mixture of different light emitted from adjacent pixels, and may define a region where a plurality of color filters 230R, 230G, and 230B are disposed.

The red color filter 230R, the green color filter 230G, and the blue color filter 230B may be alternately disposed along the first direction D1.

A planarization layer 240 may be positioned between the red color filter 230R, green color filter 230G, and blue color filter 230B, and the liquid crystal layer 3. The planarization layer 240 may flatten one surface of the red color filter 230R, the green color filter 230G, and the blue color filter 230B. The planarization layer 240 may include an organic material, but is not limited thereto, and may include any material having the flattening function.

As shown in FIG. 4, the stain correction layer 250 is positioned between a part of the planarization layer 240 positioned in the first region R1 and the liquid crystal layer 3. As shown in FIG. 5, the stain correction layer 250 is not positioned in the second region R2. The stain correction layer 250 is only selectively positioned in the first region R1.

In an exemplary embodiment of the inventive concept, the stain correction layer 250 overlaps at least one among the edge region PS, the vertical region VS, the horizontal region HS, and the atypical region CS that are included in the first region R1. The stain correction layer 250 may have a planar shape that is the same as or similar to at least one among the edge region PS, the vertical region VS, the horizontal region HS, and the atypical region CS. According to an exemplary embodiment of the inventive concept, the stain correction layer 250 is positioned along the edge of the display area DA, has a horizontal shape crossing the display area in the first direction D1, or has a vertical shape or an atypical shape (for example, a circular shape) crossing the display area in the second direction D2.

In an exemplary embodiment, the stain correction layer 250 overlaps the plurality of pixels. In an embodiment, the stain correction layer 250 includes a plurality of layers shaped to connect to each other over the plurality of pixels.

In an embodiment, the stain correction layer 250 includes a first semiconductor nanocrystal 251R, a second semiconductor nanocrystal 251G, and a third semiconductor nanocrystal 251B. The stain correction layer 250 may have a shape in which the first semiconductor nanocrystal 251R, the second semiconductor nanocrystal 251G, and the third semiconductor nanocrystal 251B are uniformly dispersed in a dispersion medium. For example, the dispersion medium may be an epoxy resin or a silicon resin. However, the dispersion medium is not limited thereto. In an exemplary embodiment, a plurality of semiconductor nanocrystals are uniformly dispersed in the dispersion medium, where the plurality includes a first number of semiconductor nanocrystals for converting incident light into red light, a second number of semiconductor nanocrystals for converting incident light into green light. The embodiment may further include a third number of semiconductor nanocrystals for converting incident light into blue light. In an embodiment, the first through third numbers are substantially the same as one another.

The first semiconductor nanocrystal 251R converts the incident light into red light. The second semiconductor nanocrystal 251G converts the incident light into green light. The third semiconductor nanocrystal 251B converts the incident light into blue light.

In an embodiment, the first semiconductor nanocrystal 251R, the second semiconductor nanocrystal 251G, and the third semiconductor nanocrystal 251B include quantum dots. The quantum dots may be independently selected from a Group II-VI compound, a Group III-V compound, a Group IV-VI compound, a Group IV element, a Group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a two-element compound selected from GaN, GaP, GaAs, GaSb, AN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles (e.g., semiconductor particles) at uniform concentrations, or they may be divided into states having partially different concentrations to be present in the same particle, respectively.

In addition, a core/shell structure in which some quantum dots enclose some other quantum dots may be possible. An interface between the core and the shell may have a concentration gradient in which a concentration of elements of the shell decreases closer to its center.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, since light emitted through the quantum dot is emitted in all directions, a viewing angle of light may be improved.

As above-described, when the channel lengths of the thin film transistors positioned in the first region R1 and the second region R2 are different, a visibility deviation may be generated between the first region R1 and the second region R2. The first region R1 including the thin film transistor having the relatively shorter channel length may appear darker than the second region R2.

According to an exemplary embodiment, the stain correction layer 250 positioned in the first region R1 may compensate for this luminance deviation. Since the stain correction layer 250 provides light having a further improved luminance toward the color filters 230R, 230G, and 230B, and the second substrate 210, the light emitted outside the second substrate 210 may have uniform luminance through the first region R1 and the second region R2.

A second polarization layer 22 is positioned between the stain correction layer 250 and the liquid crystal layer 3. The second polarization layer 22 may be at least one among the deposited polarization layer, the coating polarization layer, and the wire grid polarization layer (the wire grid polarizer). For example, the second polarization layer 22 may be a wire grid polarization layer including a metal pattern. When the second polarization layer 22 is the wire grid polarization layer, the second polarization layer 22 may include a plurality of bars having a width of several nanometers.

An insulating layer 260, a common electrode 270, and a second alignment layer 21 are positioned between the second polarization layer 22 and the liquid crystal layer 3.

The insulating layer 260 is a layer insulating the second polarization layer 22 and the common electrode 270 of the metal material. The second polarization layer 22 may be omitted when the second polarization layer 22 is not the metal material. The common electrode 270 receiving the common voltage may form an electric field with the above-described pixel electrode 191. The configuration in which the common electrode 270 is positioned in a different display panel from that of the pixel electrode 191 is described in the present specification, the invention it is not limited thereto. For example, the common electrode 270 may be included in the same display panel as the pixel electrode 191.

The liquid crystal layer 3 is positioned between the thin film transistor array panel 100 and the upper panel 200, and includes a plurality of liquid crystal molecules 31. It is possible to control transmittance of the light received from the light unit 500 according to a degree of movement of the liquid crystal molecules 31.

In an exemplary embodiment, a thickness g1 (a cell gap) of the liquid crystal layer 3 positioned in the first region R1 and a thickness g2 of the liquid crystal layer 3 positioned in the second region R2 are different from one another. The light passing through the liquid crystal layer 3 having the different thicknesses has a differentiated transmittance such that the luminance deviation due to the regions may be generated.

Since the display device according to an exemplary embodiment includes the stain correction layer 250 positioned in the first region R1, the luminance deviation may be compensated and uniform light may be provided over the entire display area DA. Also, because the stain correction layer 250 according to an exemplary embodiment includes the semiconductor nanocrystal emitting light in all directions, the viewing angle may be improved.

Figure 6:
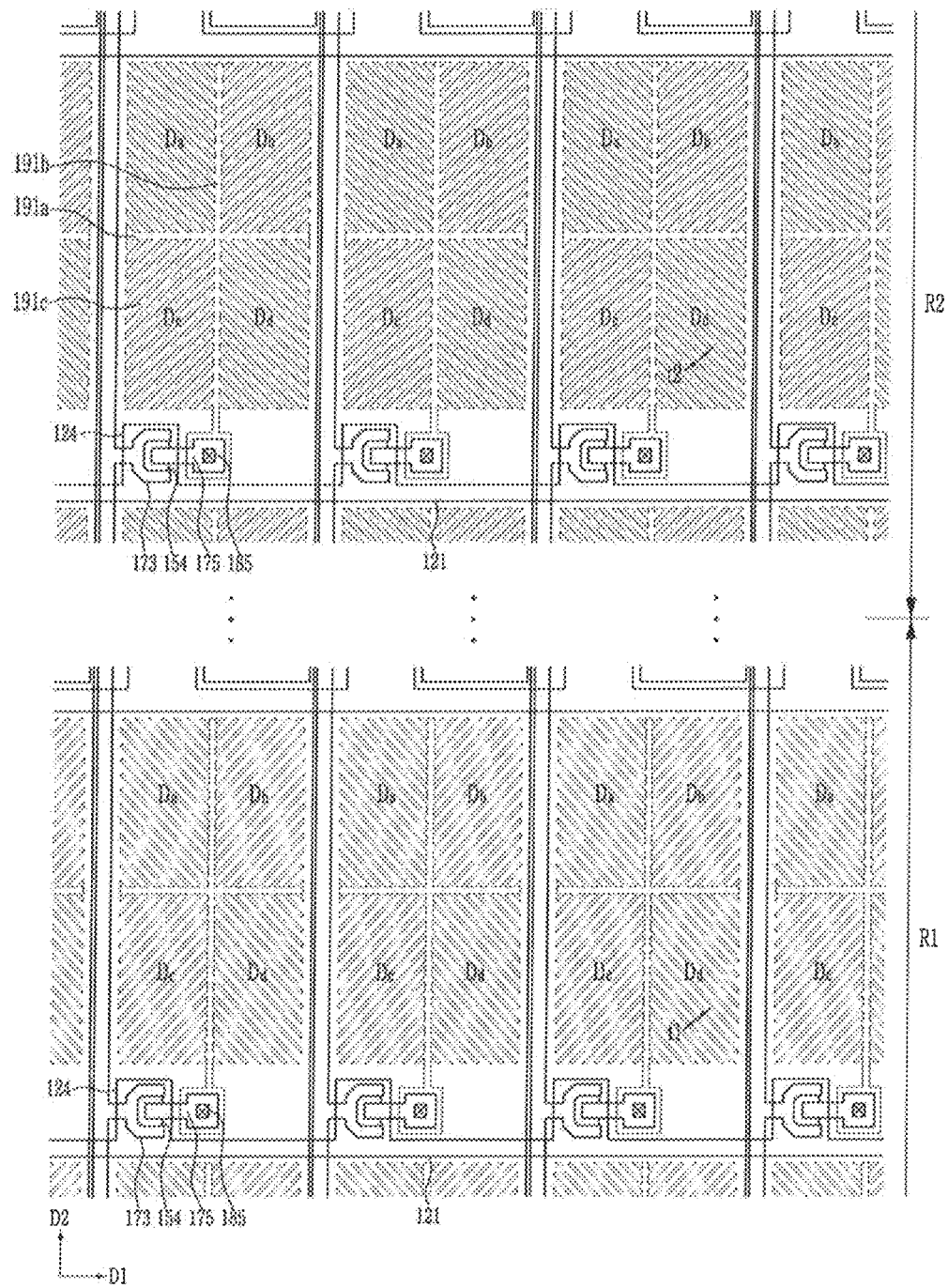
FIG. 6 is a top plan view according to an exemplary embodiment of FIG. 3.

Next, a display device according to an exemplary embodiment is described with reference to FIG. 6 to FIG. 9. FIG. 6 is a top plan view according to an exemplary embodiment of FIG. 3, and FIG. 7, FIG. 8, and FIG. 9 are cross-sectional views according to exemplary embodiments of FIG. 4, respectively. The description of the same or similar constituent elements to the above-described constituent elements is omitted.

Referring to FIG. 6, the pixel electrode 191 according to an exemplary embodiment includes a crossed stem part including a horizontal stem part 191a and a vertical stem part 191b connected to the horizontal stem part 191a to be crossed, and a plurality of minute branch parts 191c extending from the horizontal stem part 191a and the vertical stem part 191b along a diagonal direction. In an embodiment, the minute branch part 191c forms an angle of about 45 degrees or 135 degrees with the horizontal stem part 191a and the vertical stem part 191b. The minute branch parts 191c extending in different diagonal directions from each other may be crossed with each other.

In an embodiment, one pixel electrode 191 includes four regions Da, Db, Dc, and Dd divided with reference to the horizontal stem part 191a and the vertical stem part 191b. Arrangement directions of liquid crystal molecules 31 may be different in the plurality of regions.

In detail, a side of the minute branch part 191c distorts an electric field to form a horizontal component determining an inclination direction of the liquid crystal molecules 31. The horizontal component of the electric field may be substantially parallel to the side of the minute branch parts 191c. The liquid crystal molecules 31 may be inclined along a direction parallel to a length direction of the minute branch parts 191c. Because one pixel electrode 191 includes the minute branch parts 191c that are inclined in four different directions from each other, the directions in which the liquid crystal molecules 31 are inclined may be four directions. Four domains having the different alignment directions of the liquid crystal molecules 31 may be formed in the liquid crystal layer 3.

In an embodiment, the width t1 of the minute branch part 191c positioned in the first region R1 and the width t2 of the minute branch part 191c positioned in the second region R2 are different from one another. According to an exemplary embodiment, the width t1 of the minute branch part 191c positioned in the first region R1 is smaller than the width t2 of the minute branch part 191c positioned in the second region R2.

A luminance deviation may be generated between the first region R1 and the second region R2 in which the widths of the minute branch parts 191c are different from one another. The first region R1 in which the width of the minute branch part 191c is relatively small may appear darker than the second region R2.

According to an exemplary embodiment, the stain correction layer 250 is positioned in the first region R1. The stain correction layer 250 may provide light with improved luminance to the first region R1 rather than the second region R2. The uniform luminance may be provided by the stain correction layer 250 despite the difference of the pixel electrode shape of the first region R1 and the second region R2.

Figure 7:
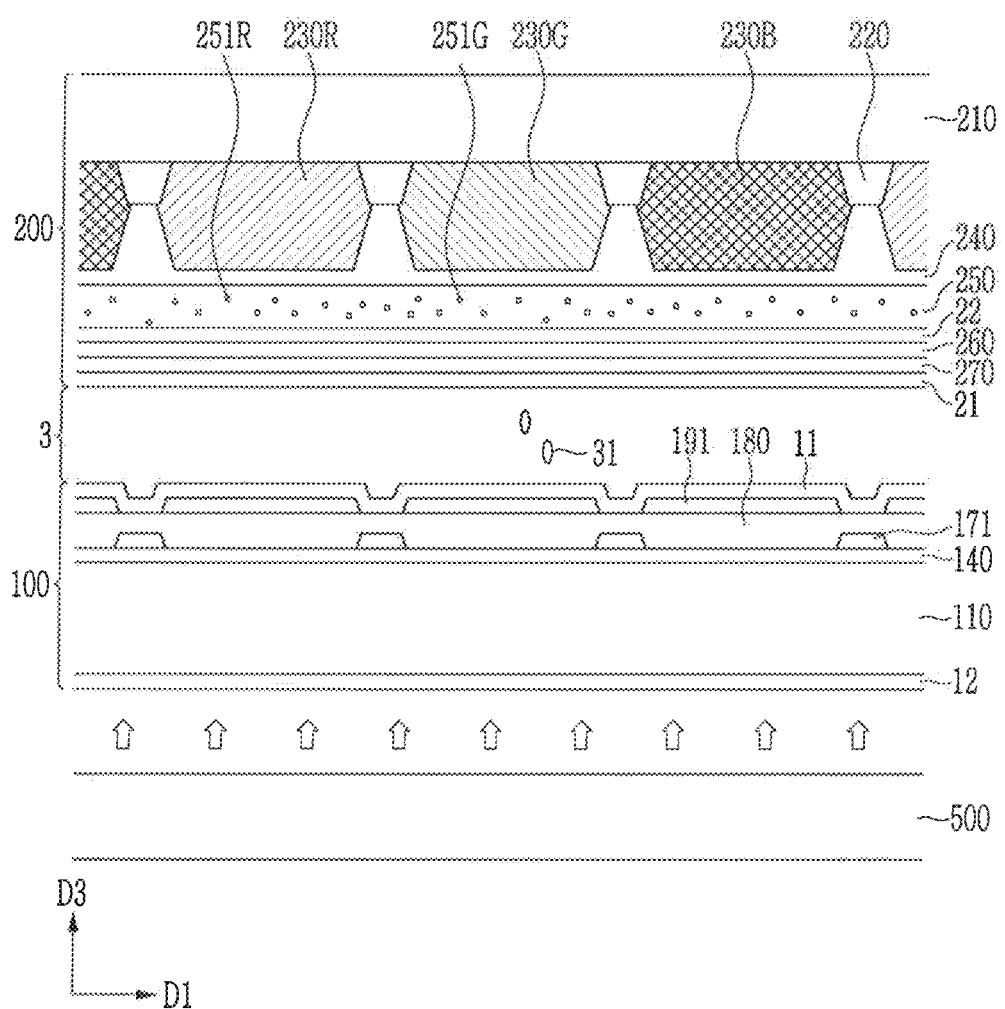
FIG. 7, FIG. 8, and FIG. 9 are cross-sectional views according to exemplary embodiments of FIG. 4, respectively.

Referring to FIG. 7, the light unit 500 according to an exemplary embodiment emits blue light. The light unit 500 may include any light source emitting blue light, and for example, may include the light emitting diode (LED).

The stain correction layer 250 includes the first semiconductor nanocrystal 251R and the second semiconductor nanocrystal 251G. The stain correction layer 250 may be a layer in which the first semiconductor nanocrystal 251R and the second semiconductor nanocrystal 251G are randomly dispersed in the dispersion medium.

The first semiconductor nanocrystal 251R converts the incident blue light into the red light, and the second semiconductor nanocrystal 251G converts the incident blue light into the green light. According to an exemplary embodiment, the light of the combination of the blue light emitted from the light unit 500, the red light generated by the first semiconductor nanocrystal 251R, and the green light generated by the second semiconductor nanocrystal 251G are provided to the color filters 230R, 230G, and 230B. The light includes the red light and the green light converted by the semiconductor nanocrystal, and thus light with improved luminance may be provided.

Figure 8:
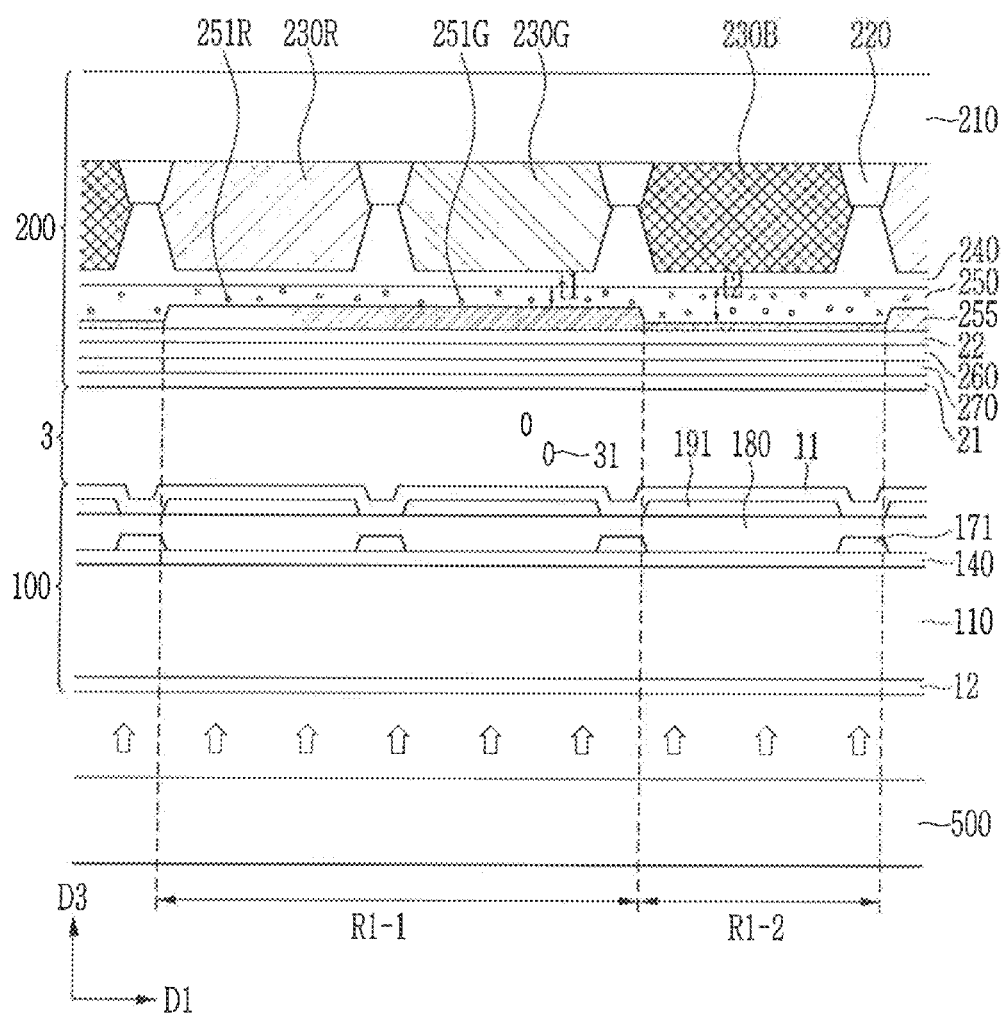

Referring to FIG. 8, in an exemplary embodiment, the stain correction layer 250 positioned in the first region R1 includes a plurality of regions having different thicknesses from each other. The first region R1 includes a first sub-region R1-1 and a second sub-region R1-2. The thickness t1 of the stain correction layer 250 positioned in the first sub-region R1-1 is smaller than the thickness t2 of the stain correction layer 250 positioned in the second sub-region. While the present specification describes an exemplary embodiment in which the first region R1 includes two regions in which the thicknesses of the stain correction layer 250 are different, the invention is not limited thereto. For example, the first region R1 may include more than two regions.

In an embodiment, the number of semiconductor nanocrystals positioned in the second sub-region R1-2 is larger than the number of semiconductor nanocrystals positioned in the first sub-region R1-1. The amount of the light provided from the stain correction layer 250 positioned in the second sub-region R1-2 may be larger than the amount of the light provided from the stain correction layer 250 positioned in the first sub-region R1-1. As the thickness of the stain correction layer 250 becomes thicker, a greater amount of light may be provided in the direction of the second substrate 210.

The luminance deviation may also be differentiated in the first region R1. To provide the uniform luminance by the display device, the light supplied according to the luminance deviation may be different. The thickness of the stain correction layer 250 positioned in the second sub-region R1-2 having the large luminance deviation with the second region R2 may be larger than the thickness of the stain correction layer 250 positioned in the first sub-region R1-1 having the relatively small luminance deviation. The light emitted outside the second substrate 210 may be uniform over the first region R1 and the second region R2.

A second planarization layer 255 may be positioned between the stain correction layer 250 and the second polarization layer 22. Accordingly, one surface on which the second polarization layer 22 is positioned is flattened.

Figure 9:
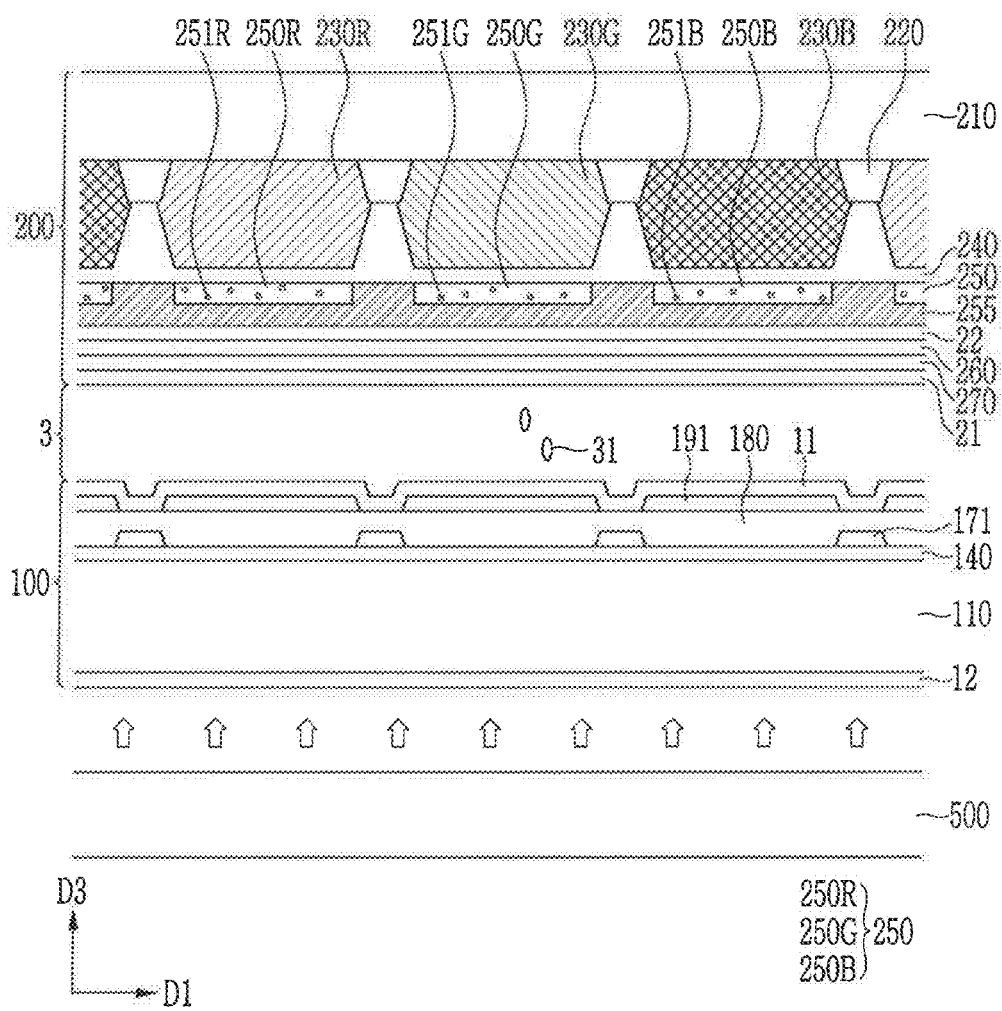

Next, referring to FIG. 9, the stain correction layer 250 is positioned between the planarization layer 240 and the liquid crystal layer 3. The stain correction layer 250 according to an exemplary embodiment includes a first stain correction layer 250R, a second stain correction layer 250G, and a third stain correction layer 250B.

The first stain correction layer 250R overlaps the red color filter 230R emitting red light, and may be positioned with an island shape or a stripe shape. The first stain correction layer 250R includes the first semiconductor nanocrystal 251R converting the incident light into the red light.

The second stain correction layer 250G overlaps the green color filter 230G emitting green light, and may be positioned with the island shape or the stripe shape. The second stain correction layer 250G includes the second semiconductor nanocrystal 251G converting the incident light into the green light.

The third stain correction layer 250B overlaps the blue color filter 230B emitting blue light, and may be positioned with the island shape or the stripe shape. The third stain correction layer 250B includes the third semiconductor nanocrystal 251B converting the incident light into the blue light.

The first stain correction layer 250R, the second stain correction layer 250G, and the third stain correction layer 250B may have independent separate shapes.

The second planarization layer 255, the second polarization layer 22, the insulating layer 260, the common electrode 270, and the second alignment layer 21 may be sequentially positioned between the first stain correction layer 250R, second stain correction layer 250G, and third stain correction layer 250B, and the liquid crystal layer 3.

Figure 10:
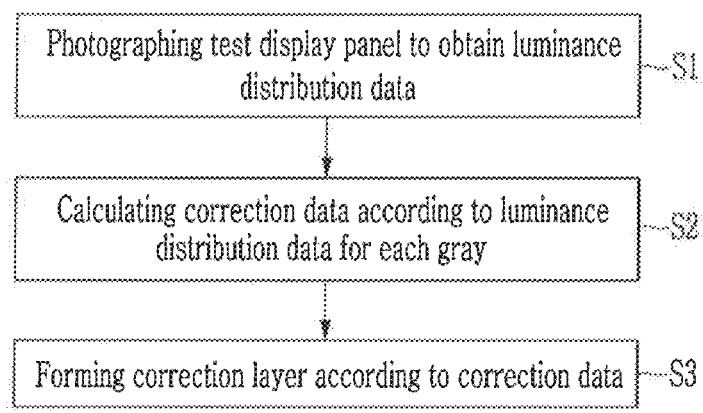
FIG. 10 is a flowchart including a method for calculating a position and a thickness of a stain correction layer according to an exemplary embodiment of the inventive concept.
Figure 13:
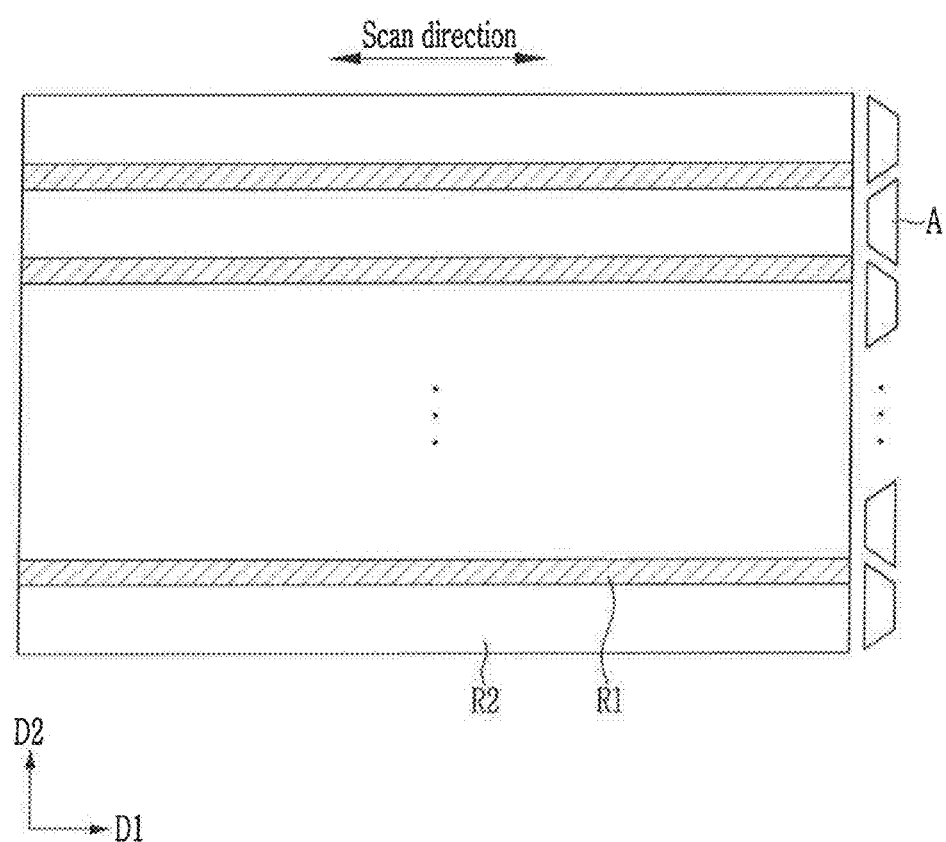
FIG. 13 is a top plan view schematically showing a process in which exposure is performed.
Figure 14:
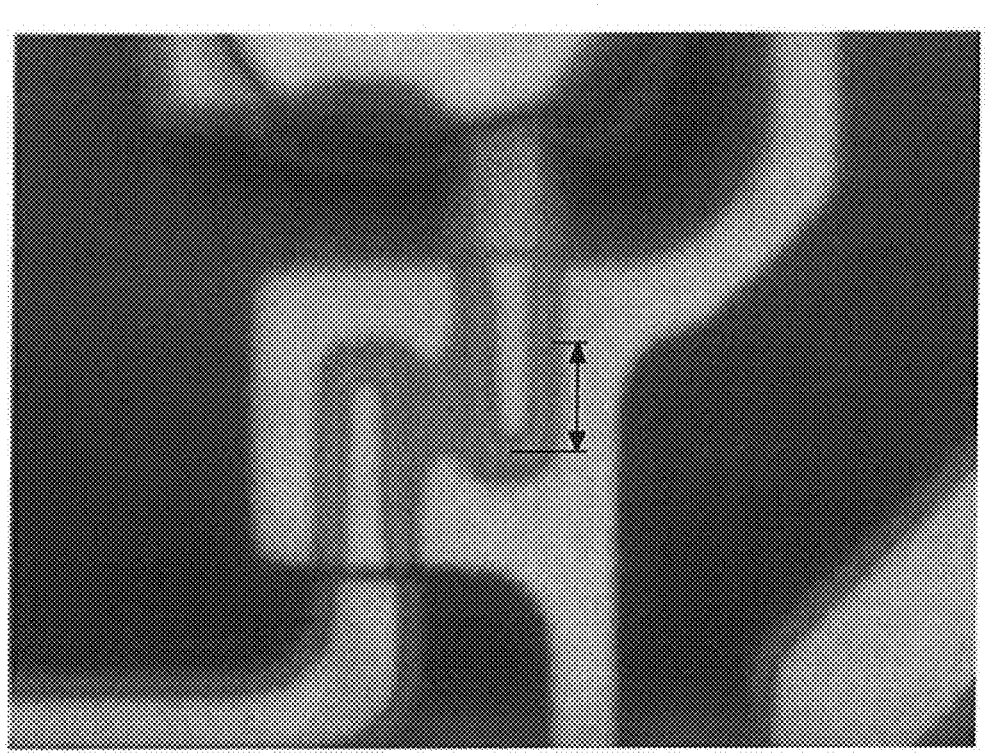
FIG. 14 is a view showing an image of a thin film transistor positioned at a first region of FIG. 13.
Figure 15:
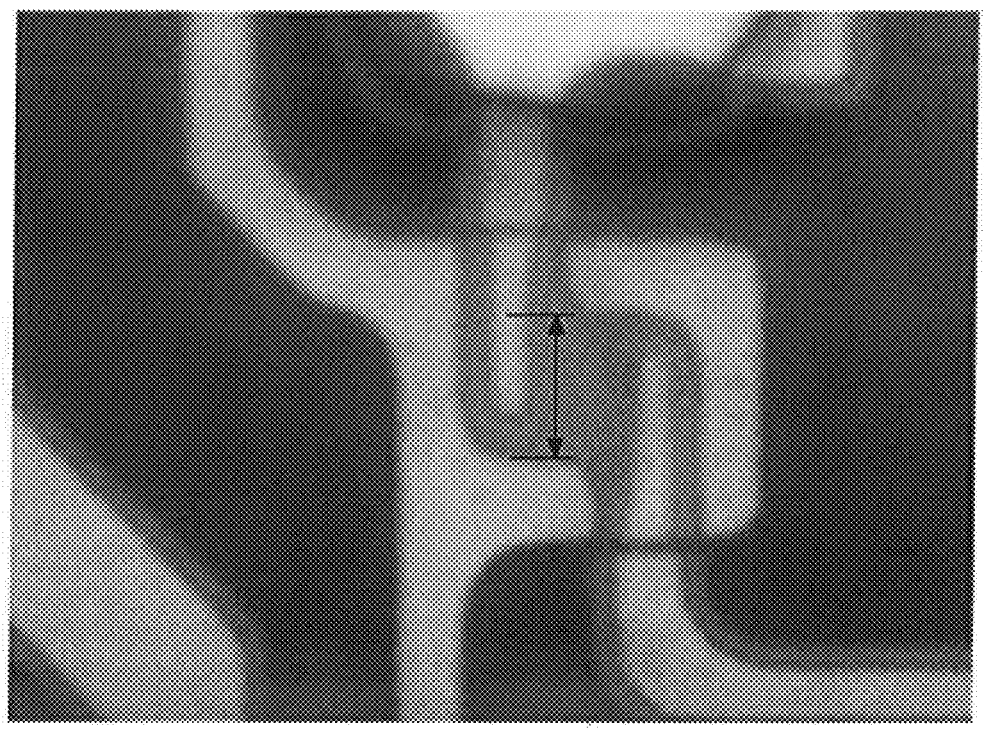
FIG. 15 is a view showing an image of a thin film transistor positioned at a second region of FIG. 13.

Next, contents related to the stain correction layer are described with reference to FIG. 10 to FIG. 15. FIG. 10 is a flowchart for calculating a position and a thickness of a stain correction layer according to an exemplary embodiment of the inventive concept, FIG. 11 and FIG. 12 are views showing an image of a display device in which a stain appears, FIG. 13 is a top plan view schematically showing a process in which exposure is performed, FIG. 14 is a view showing an image of a thin film transistor positioned at a first region of FIG. 13, and FIG. 15 is a view showing an image of a thin film transistor positioned at a second region of FIG. 13.

Referring to FIG. 10, the display panel for a test is photographed (or observed) by a camera to obtain luminance distribution data (S1). For example, the test display panel may be photographed at a distance of 1 m from the center of the test display panel. A reference image for each gray according to a test signal may be obtained through the photographing, and luminance distribution data may be obtained from the reference images. A luminance deviation correction data is calculated using the luminance distribution data (S2). The first region where the stain preventing layer is to be located and the thickness of the stain preventing layer may be determined according to the luminance deviation correction data. Based on these determinations, a display device according to an exemplary embodiment may be manufactured to include the above-described stain correction layer (S3).

Figure 11:
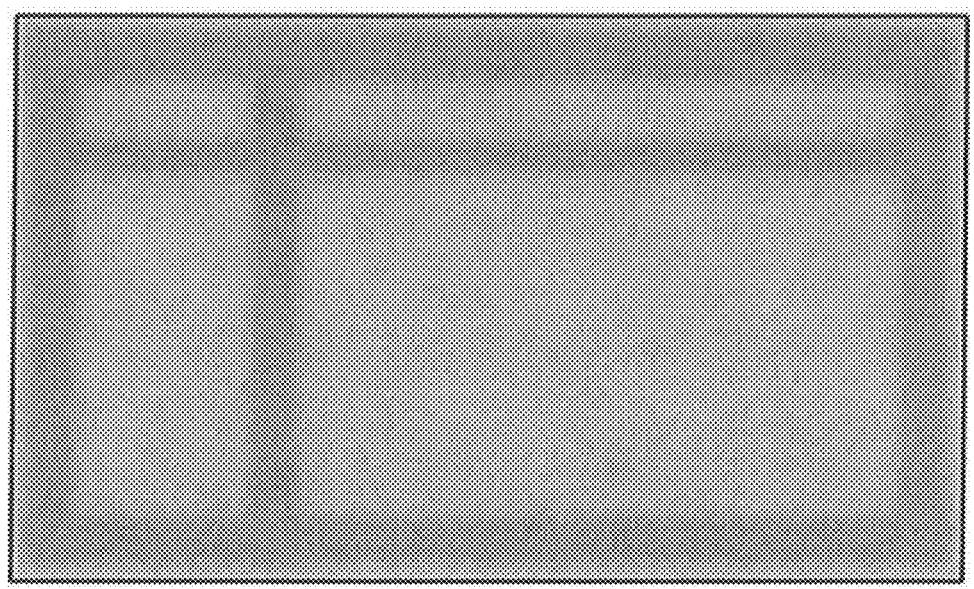
FIG. 11 and FIG. 12 are views showing an image of a display device in which a stain appears.
Figure 12:
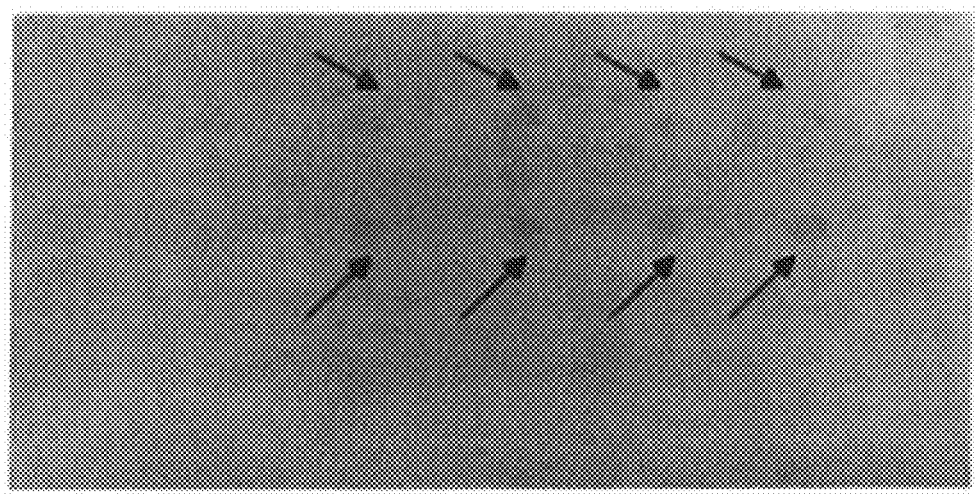

Referring to FIG. 11 and FIG. 12, it may be observed that the test display panel includes a dark part where some regions appear dark, in step (S1) of FIG. 10. In detail, as shown in FIG. 11, an edge stain positioned according to the edge of the display area, and a transverse line stain and a longitudinal line stain crossing the display area may be observed. Also, as shown in FIG. 12, the stain of the atypical shape (for example, the circular shape) may be recognized. The display device according to an exemplary embodiment may include the first region corresponding to these stains or dark parts, and the shape and the position may be varied according to an exemplary embodiment.

The cause of the stain is described with reference to FIG. 13. FIG. 13 describes one example of a cause of the transverse line stain.

Referring to FIG. 13, in the process of performing an exposure for the display panel, a plurality of light exposers A may have a region where they overlap each other. The region where adjacent light exposers A perform the exposure may be overlapped. The pixels positioned in the overlapped region may be exposed in duplicate multiple times. The thin film transistor may be over-etched compared with an original design as the exposure of multiple times is executed. That is, the first region R1 exposed by the plurality of light exposers may have a high etching degree of the constituent elements compared with the second region R2 exposed by only one light exposer.

According to the overlapping etching, the channel length of the thin film transistor positioned in the first region R1 as shown in FIG. 14 may be shorter than the channel length of the thin film transistor positioned in the second region R2 as shown in FIG. 15. Also, as above-described, the width of the minute branch part positioned in the first region may be smaller than the width of the minute branch part positioned in the second region. When the length of the channel or the shape of the pixel electrode is different in the display area, the stain or the dark part may be recognized while the corresponding region causes the luminance deviation.

As above-described, the display device according to an exemplary embodiment of the inventive concept includes the stain correction part to reduce instances of stain recognition and non-uniform luminance.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure.

What is claimed is:

1. A display device comprising:
   a first substrate including a display area comprising a first region and a second region excluding the first region;
   a plurality of thin film transistors positioned on the first substrate;
   a plurality of pixel electrodes connected to the thin film transistor;
   a plurality of color filters overlapping the pixel electrodes;
   a second substrate overlapping the first substrate;
   a liquid crystal layer positioned between the first substrate and the second substrate; and
   a stain correction layer positioned between the second substrate and the liquid crystal layer and including a semiconductor nanocrystal, the stain correction layer disposed in the first region,
   wherein the stain correction layer is disposed with overlapping the pixel electrodes in the first region and without overlapping the pixel electrodes in the second region.

2. The display device of claim 1, wherein the first region includes a horizontal or vertical portion that crosses the display area.

3. The display device of claim 1, wherein the first region includes a circular shaped region.

4. The display device of claim 1, wherein the first region includes a frame shaped region that overlaps respective edges of the display area.

5. The display device of claim 1, wherein the thin film transistor comprises:
   a first thin film transistor positioned in the first region; and
   a second thin film transistor positioned in the second region,
   wherein channel lengths of the first thin film transistor and the second thin film transistor are different from one another.

6. The display device of claim 5, wherein the channel length of the first thin film transistor is shorter than the channel length of the second thin film transistor.

7. The display device of claim 1, wherein a thickness of the liquid crystal layer overlapping the first region and a thickness of the liquid crystal layer overlapping the second region are different from one another.

8. The display device of claim 1, wherein each of the pixel electrodes includes a crossed stem part and a minute branch part extending from the crossed stem part, and the width of the minute branch part positioned in the first region is different from the width of the minute branch part positioned in the second region.

9. The display device of claim 8, wherein the width of the minute branch part positioned in the first region is smaller than the width of the minute branch part positioned in the second region.

10. The display device of claim 1, wherein the stain correction layer comprises a plurality of layers shaped to connect to each other over the pixel electrodes of the first regions.

11. The display device of claim 1, wherein the stain correction layer comprises:
 a first semiconductor nanocrystal converting incident light into red light, and
 a second semiconductor nanocrystal converting the incident light into green light.

12. The display device of claim 11, further comprising a third semiconductor nanocrystal converting the incident light into blue light.

13. The display device of claim 1, wherein the stain correction layer comprises:
 a first stain correction layer overlapping a region emitting red light,
 a second stain correction layer overlapping a region emitting green light, and
 a third stain correction layer overlapping a region emitting blue light.

14. The display device of claim 13, wherein the first stain correction layer, the second stain correction layer, and the third stain correction layer are separated from each other.

15. The display device of claim 1, wherein the stain correction layer positioned in the first region includes a plurality of regions having different thicknesses.

16. A display device comprising:
 a first substrate including a display area comprising a first region and a second region;
 a plurality of thin film transistors positioned on the first substrate;
 a plurality of pixel electrodes connected to the thin film transistors;
 a stain correction layer including a semiconductor nanocrystal and positioned in the first region with overlapping the pixel electrodes of the first region without overlapping the pixel electrodes in the second region;
 a second substrate overlapping the first substrate; and
 a color filter positioned between the second substrate and the stain correction layer,
 wherein the thin film transistors includes a first thin film transistor disposed in the first region and second thin film transistor disposed in the second region, and
 wherein a channel length of the first thin film transistor is different from a channel length of the second thin film transistor positioned in the second region.

17. The display device of claim 16, wherein the first region includes a horizontal or vertical portion that crosses the display area.

18. The display device of claim 16, wherein the channel length of the first thin film transistor is shorter than the channel length of the second thin film transistor.

19. The display device of claim 16, further comprising:
 a liquid crystal layer positioned between the first substrate and the second substrate, and
 a thickness of the liquid crystal layer overlapping the first region and a thickness of the liquid crystal layer overlapping the second region are different.

20. The display device of claim 16, wherein each of the pixel electrodes includes a crossed stem part and a minute branch part extending from the crossed stem part, and the width of the minute branch part positioned in the first region is different from the width of the minute branch part positioned in the second region.

21. The display device of claim 16, wherein stain correction layer includes a plurality of layers connected to each other over the pixel electrodes of the first region.

22. The display device of claim 21, wherein the stain correction layer comprises:
 a first semiconductor nanocrystal converting incident light into red light, and
 a second semiconductor nanocrystal converting the incident light into green light.

* * * * *